(12) United States Patent
Piepenstock et al.

(10) Patent No.: US 8,970,300 B2
(45) Date of Patent: Mar. 3, 2015

(54) APPARATUS AND METHOD FOR TRANSIMPEDANCE AMPLIFIERS WITH WIDE INPUT CURRENT RANGES

(71) Applicant: Texas Instruments Deutschland GmbH, Freising (DE)

(72) Inventors: Oliver Piepenstock, Lower Saxony (DE); Gerd Schuppener, Allen, TX (US); Frank Gelhausen, Lower Saxony (DE); Ulrich Schacht, Lower Saxony (DE)

(73) Assignee: Texas Instruments Deutschland GmbH, Freising (DE)

( * ) Notice: Subject to any disclaimer, the term of this patent is extended or adjusted under 35 U.S.C. 154(b) by 40 days.

(21) Appl. No.: 13/863,429

(22) Filed: Apr. 16, 2013

(65) Prior Publication Data

US 2014/0306760 A1    Oct. 16, 2014

(51) Int. Cl.
*H03F 3/45*    (2006.01)

(52) U.S. Cl.
USPC .............. 330/254; 330/308; 330/85; 330/307

(58) Field of Classification Search
None
See application file for complete search history.

(56) References Cited

U.S. PATENT DOCUMENTS

| | | | |
|---|---|---|---|
| 4,889,985 A * | 12/1989 | Allsop et al. | 250/214 A |
| 5,708,392 A | 1/1998 | Gross | |
| 5,812,030 A | 9/1998 | Inami et al. | |
| 6,342,694 B1 * | 1/2002 | Satoh | 250/214 A |
| 6,756,851 B2 * | 6/2004 | Mejri | 330/289 |
| 6,759,900 B1 | 7/2004 | Chen | |
| 6,778,021 B2 | 8/2004 | Denoyer et al. | |
| 6,801,084 B2 * | 10/2004 | Smith et al. | 330/98 |
| 6,885,249 B2 * | 4/2005 | Suzunaga | 330/308 |
| 6,894,564 B1 * | 5/2005 | Gilbert | 330/254 |
| 7,233,209 B2 | 6/2007 | Braier et al. | |
| 2003/0151458 A1 | 8/2003 | Smith et al. | |

FOREIGN PATENT DOCUMENTS

JP    2006261866    9/2006

OTHER PUBLICATIONS

Meyer, Robert G., "A Wideband Low-Noise Variable Gain BiCMOS Transimpedance Amplifier", IEEE Journal of Solid-State Circuits, vol. 29, No. 6, Jun. 1994.

* cited by examiner

*Primary Examiner* — Patricia Nguyen
(74) *Attorney, Agent, or Firm* — Alan A. R. Cooper; Frederick J. Telecky, Jr.

(57) ABSTRACT

Improved preamplifier circuits for converting single-ended input current signals to differential output voltage signals, including first and second transimpedance amplifiers with input transistors operating according to bias currents from a biasing circuit, output transistors and adjustable feedback impedances modified using an automatic gain control circuit, as well as a reference circuit controlling the bias currents according to an on-board reference current and the single-ended input or the differential output voltage signals from the transimpedance amplifiers.

20 Claims, 4 Drawing Sheets

APPARATUS AND METHOD FOR TRANSIMPEDANCE AMPLIFIERS WITH WIDE INPUT CURRENT RANGES

FIELD OF THE INVENTION

The present disclosure involves preamplifier or preamp circuitry, and more particularly preamplifiers for converting input current signals to output voltage signals.

BACKGROUND

Preamplifiers are used in a variety of applications, for example, to convert a signal current input from a photodiode into a voltage signal for subsequent processing, such as in a fiber optic receiver system. Preamp circuits such as these provide one or more transimpedance amplifiers or TIAs, where two TIAs can be used to convert a single-ended input current signal to a differential output voltage signal. For a given application and associated input current sensitivity level, a transimpedance amplifier is designed with respect to various performance parameters including bandwidth, gain, gain-peaking, group-delay and input referred noise. However, applications requiring a wider range of input currents can suffer from saturation effects, potentially leading to significant degradation of one or more performance parameters, as well as high pulse width distortion (PWD) and deterministic jitter (DJ) at the signal path output. Consequently, a need remains for improved preamplifiers and integrated circuits with the capability of operating with acceptable performance parameters over a wide range of input current signal amplitudes.

SUMMARY

The present disclosure involves preamplifier topologies providing adjustment of the transimpedance amplifier operating conditions based on the amplitude or magnitude of the input current signal to facilitate satisfaction of design parameters across a wide input current range. Unlike conventional designs, the various concepts of the present disclosure may be successfully employed to allow application of a given preamplifier design using one or more transimpedance amplifiers in situations in which the input signal may vary widely without significant degradation of bandwidth, gain, gain-peaking, group-delay, input referred noise and without high pulse width distortion or deterministic jitter.

A preamplifier circuit is provided, including a first transimpedance amplifier that receives an input signal and provides a first voltage output signal, as well as a second transimpedance amplifier matched to the first transimpedance amplifier which provides a second voltage output signal. A biasing circuit provides first and second biasing currents to the respective transimpedance amplifiers based at least in part on a reference current. The preamplifier circuit further includes a reference circuit controlling the reference current provided to the biasing circuit based at least in part on an offset signal, and an offset circuit provides the offset signal according to a differential voltage output signal derived from the first and second voltage output signals. The use of the offset signal to control the transimpedance amplifier biasing currents can be successfully employed to advantageously facilitate operation over a wide input current range while maintaining acceptable performance parameters, thus representing a significant advance over conventional preamplifier designs.

Certain embodiments further include a DC cancellation circuit operative to selectively remove all or a portion of a DC component of the input signal based on the offset signal. An automatic gain control (AGC) circuit may be included in certain embodiments to control the transimpedance amplifier gains at least partially according to the differential output voltage signal. The transimpedance amplifiers may include feedback resistors and gain control transistors connected in parallel with the feedback resistors, with the AGC circuit providing gate control signals to the gain control transistors to reduce the transimpedance amplifier gains for increasing differential voltage output signal amplitude and vice versa. In certain embodiments, moreover, the reference circuit controls the reference current at least partially according to a reciprocal of the offset signal amplitude to reduce the transimpedance amplifier biasing currents and thereby reduce the transimpedance amplifier gains for increasing differential voltage output signal amplitude and vice versa.

An integrated circuit apparatus is provided in accordance with further aspects of the disclosure, including a biasing circuit with first and second MOSFETs having gate terminals coupled to one another, source terminals coupled to a voltage supply node, and drain terminals respectively providing first and second biasing currents according to a control voltage at the gate terminals. The apparatus further includes first and second transimpedance amplifiers which individually include an input transistor that receives the corresponding biasing current through a corresponding resistor along with an emitter follower transistor and a feedback resistor connected between the emitter follower transistor emitter and the input transistor base terminal. The base of the input transistor of the first transimpedance amplifier is connected to receive an input signal, and the transimpedance amplifiers provide a differential voltage output representing the amplitude of the input signal. In certain embodiments, the first and second transimpedance amplifiers are matched one another. The apparatus further includes a reference circuit providing a reference current output to modify the biasing circuit control voltage in order to control the first and second biasing currents based at least in part on the differential voltage output and according to a reference current generated in the integrated circuit. This architecture advantageously employs the differential voltage output to alter the transimpedance amplifier biasing accordingly, thereby self-adjusting the operation for changes in input signal level to meet the above-mentioned design parameters while keeping PWD and DJ values low to facilitate reduced power consumption for high input signal levels.

In certain embodiments, a MOSFET is coupled between the first amplifier input transistor base terminal and a circuit ground, and is controlled at least partially according to the differential voltage output signal to selectively remove at least a portion of a DC component of the input signal. Certain embodiments of the integrated circuit apparatus include an AGC circuit controlling gains of the first and second transimpedance amplifiers at least partially according to the differential voltage output signal. In certain embodiments, moreover, the reference circuit controls the reference current output at least partially according to the reciprocal of the amplitude of the differential voltage output signal so as to reduce the transimpedance amplifier biasing currents and thus reduce the transimpedance amplifier gains for increasing differential voltage output signal amplitude and vice versa.

In accordance with further aspects of the disclosure, a preamplifier is provided for converting a single-ended input current signal to a differential output voltage signal. The preamplifier includes a signal transimpedance amplifier which receives the single-ended input current signal, as well as a dummy transimpedance amplifier which is matched to the signal transimpedance amplifier and which receives no input signal. The signal and dummy transimpedance amplifiers provide the differential output voltage signal at least partially according to the input current signal and according to a biasing current source derived from a reference current source implemented within the preamplifier, and according to an automatic gain control circuit signal.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
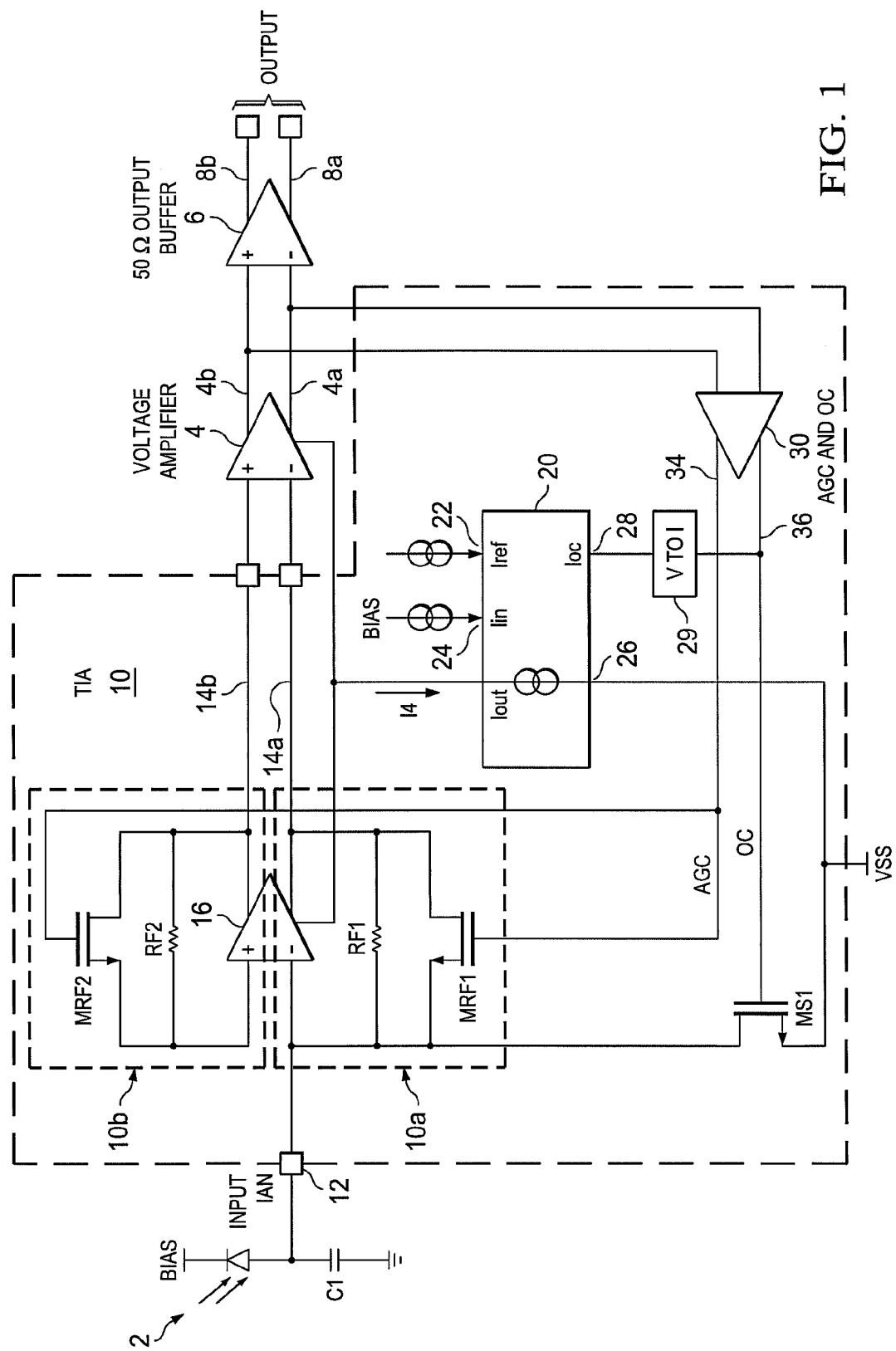
FIG. 1 is a schematic diagram illustrating an exemplary preamplifier with two transimpedance amplifiers, one of which receives a single-ended input current signal, with automatic gain control and offset cancellation circuits providing outputs according to an amplified differential voltage output signal, as well as reference circuitry controlling TIA biasing currents at least partially according to the differential voltage output in accordance with certain aspects of the present disclosure.

One or more embodiments or implementations are hereinafter described in conjunction with the drawings, wherein like reference numerals are used to refer to like elements throughout, and wherein the various features are not necessarily drawn to scale.

Referring initially to FIG. 1, the present disclosure provides preamplifier topologies and apparatus for converting input current signals to output voltage signals while advantageously employing automatic gain control and offset adjustment based on output voltage feedback which can be implemented to provide operation across a wide range of input signal amplitudes while maintaining performance parameters within acceptable limits. This provides significant improvement over prior preamplifier circuit designs, an example of which is illustrated and described in U.S. Pat. No. 7,233,209 assigned to the assignee the of the present disclosure, the entirety of which is incorporated herein by reference.

FIG. 1 illustrates a preamplifier circuit apparatus 10 in one possible application in which an input current signal IAN is received from a photodiode 2 connected between the preamplifier input terminal 12 and a bias source BIAS, where the figure represents a capacitance of the photodiode 2 as a capacitor C1 connected between the anode of the photodiode 2 at the input terminal 12 and a ground. In one non-limiting example, the preamplifier circuit 10 is part of an optical fiber communication system receiver which receives an optical signal via the photodiode 2 and the preamplifier 10 provides a differential voltage output representing the current signal received from the photodiode 2 for further processing by the host system (not shown).

As seen in FIG. 1, the preamplifier 10 has a single-ended input 12 with a dual transimpedance amplifier architecture represented as an amplifier 16, including a first or signal transimpedance amplifier or TIA 10a receiving the input signal via terminal 12 and a second or "dummy" transimpedance amplifier 10b that receives no input signal. The transimpedance amplifiers 10a and 10b provide a differential output voltage signal at nodes 14a and 14b representing the amplitude of the received input current signal from the photodiode 2. In this example, moreover, a voltage amplifier 4 receives the differential output voltage signal from the nodes 14a and 14b and provides an amplified differential voltage at nodes 4a and 4b as an input to a 50Ω output buffer 6. The output of the buffer 6 is provided as an overall preamplifier differential output at nodes 8a and 8b, which can be used by a host system such as a fiber-optic receiver (not shown). In certain embodiments, the preamplifier 10 is constructed as a single integrated circuit (IC), which may, but need not, include the voltage amplifier 4 and/or the output buffer 6. In other implementations, the preamplifier 10 is implemented as a stand-alone integrated circuit, with the voltage amplifier 4 and the buffer 6 being implemented separately. Moreover the preamplifier 10 might be implemented as a functional block into a system on silicon, e.g. a transceiver IC.

The output of the voltage amplifier 4 is also provided as a differential voltage input to an automatic gain control (AGC) and offset cancellation (OC) circuit 30. The circuit 30 provides an AGC output at node 34 for automatic gain control of the first and second TIAs 10a and 10b. As shown in FIG. 1, the AGC signal 34 is used as a gate drive signal to N-channel gain control MOSFETs MRF1 and MRF2 coupled in parallel with TIA feedback resistors RF1 and RF2 such that the signal 34 modifies the gains of the TIAs 10a and 10b, respectively.

In addition, the circuit 30 provides an offset cancellation or OC output at node 36 which is used as an input by a DC cancellation circuit including an N-channel MOSFET transistor MS1 coupled between the current signal input terminal 12 and a circuit ground node VSS. In operation, the cancellation circuit transistor MS1 selectively removes at least a portion of a DC component of the input signal at terminal 12 according to the offset signal 36 at least partially according to the OC output 36 and hence according to the differential voltage output signal 14a, 14b from the voltage amplifier 4. In this manner, the DC content of the input current signal is reduced or canceled via feedback from the AGC/OC circuit 30.

In addition, as seen in FIG. 1, the offset signal 36 (OC) is also provided to a reference circuit 20 via a voltage-to-current (V to I) circuit 29 as a current signal 28 (Ioc). The reference circuit 20 controls a reference current I4 (Iout) that is used for controlling the bias of the transimpedance amplifiers 10a and 10b based on the received current signal 28 as well as a BIAS current input 24 (Iin) and a reference current Iref received at an input 22. In addition, the reference current Iref provided to the input 22 is generated in the integrated circuit of the preamplifier 10 (not shown) so as to track any process, voltage and/or temperature (PVT) changes. As seen in FIG. 1, moreover, the reference current I4 may also be used to bias the voltage amplifier 4, although not a strict requirement of the present disclosure.

Figure 2:
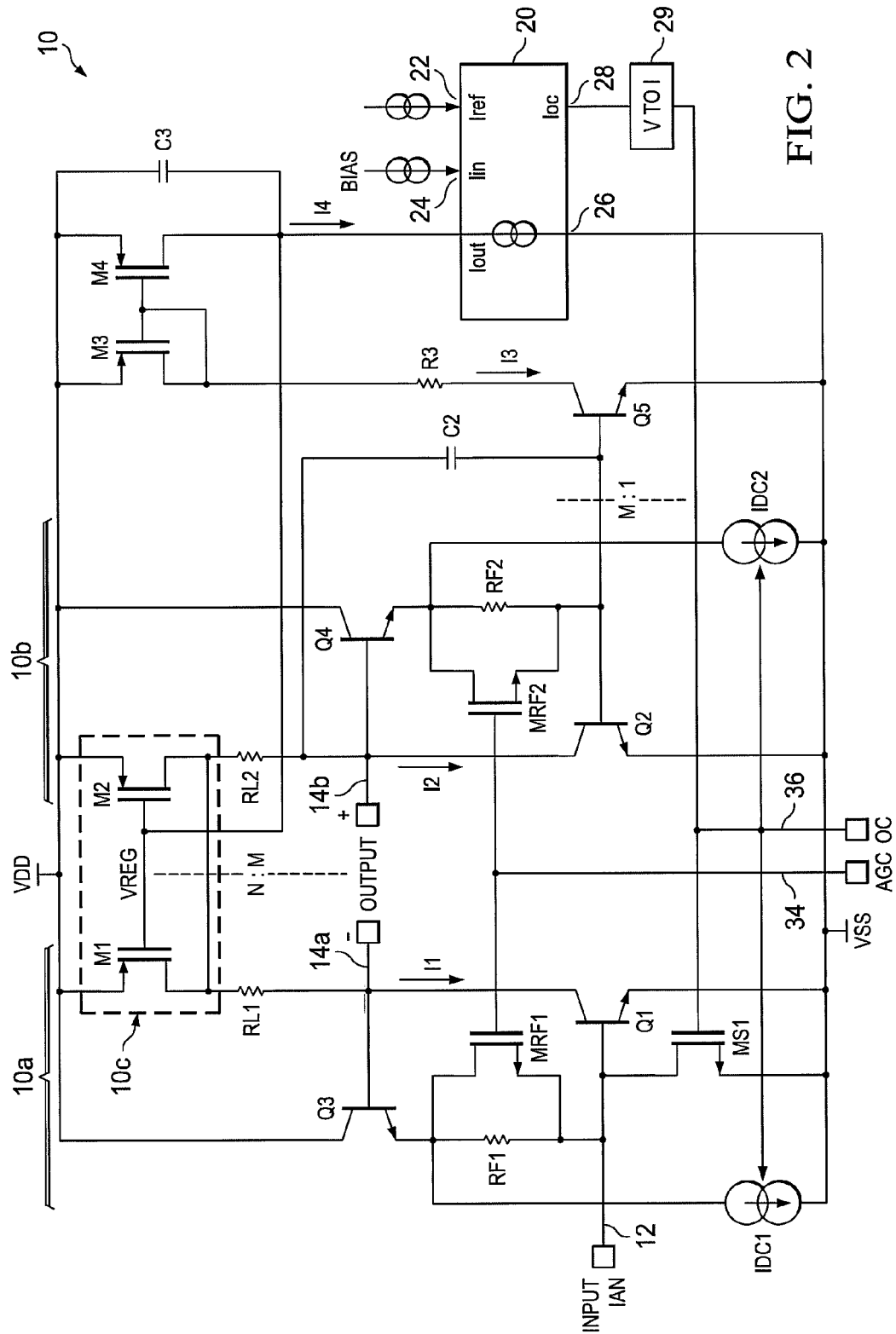
FIG. 2 is a schematic diagram illustrating further details of an exemplary preamplifier circuit implementation with the reference circuit controlling a biasing circuit control voltage via a controlled reference current according to an offset cancellation input signal, and with gain control field effect transistors controlling transimpedance amplifier gains according to an AGC input signal derived according to the differential voltage output.

FIG. 2 illustrates one possible non-limiting embodiment of the preamplifier circuit 10, including first and second TIAs 10a and 10b along with a biasing circuit 10c providing first and second biasing currents I1 and I2 to the respective TIAs 10a and 10b. In this implementation, the first (signal) TIA 10a includes a first input transistor Q1 with a base terminal receiving the input signal 12, as well as a collector coupled to the biasing circuit 10c through a first resistor RL1 and an emitter terminal coupled to VSS, where the collector of Q1 provides the first output voltage signal at node 14a. In addition, the first TIA 10a includes an emitter follower transistor Q3 with a base terminal connected to the collector of Q1 and a collector connected to a supply voltage node VDD, as well as a feedback resistor RF1 connected between the emitter of Q3 in the base of Q1. In addition, a first current source IDC1 is connected between the emitter of Q3 and VSS. In operation, the common-emitter configuration of Q1 and common-collector output transistor Q3 provides the output at node 14a based on the received input current signal at the base of Q1, where the feedback resistor RF1 sets the transimpedance gain. In addition, as shown above in FIG. 1, a gain control MOSFET MRF1 operates according to the AGC control signal 34 to selectively modify the impedance between the emitter of Q3 and the base of Q1, thereby selectively modifying the gain of the first transimpedance amplifier 10a through the parallel feedback impedance of RF1 and the source-drain resistance of MRF1.

In this configuration, with no input current, the voltage at the emitter of Q3 is equal to the base-emitter voltage of Q1, and the collector of Q1 is at a voltage approximately twice that of the emitter of Q3, whereby the voltage across the feedback resistor RF1 is approximately zero. In this condition, the collector-emitter current I1 through Q1 is approximately the voltage at the drain of a biasing circuit FET M1 and M2 minus 2 Vbe divided by the resistance of RL1, and the collector current of Q3 is set by the DC current source IDC1. In this manner, the circuit is self-biasing dependent on process (Vbe, RL1), temperature (temperature effects on Vbe) and the supply voltage VDD modified by the operation of the biasing circuit 10c (PVT). However, operation of the biasing circuit 10c and the control thereof according to the differential output voltage 14a and 14b using the reference circuit 20 according to on-chip reference currents providing inputs 22 and 24 allows tailoring of the biasing current I1 to maintain operational parameters with an acceptable range in the presence of such PVT effects. In operation, therefore, the signal TIA 10a provides the voltage output at node 14a representing the amplitude of the input current signal received at node 12.

As further shown in FIG. 2, the second or dummy TIA 10b includes an input transistor Q2 with a collector coupled to receive the biasing current I2 from the biasing circuit 10c through a second resistor RL2, with an emitter coupled to VSS, along with an emitter follower transistor Q4 including a collector coupled to VDD, a base coupled to a second output node 14b at the collector of Q2, and an emitter coupled through a second DC current source IDC2 to VSS, with a second feedback resistor RF2 and associated gain control MOSFET MRF2 coupled between the emitter of Q4 and the base of Q2. As connected, therefore, the second TIA 10b does not receive an input signal, but the dual TIA configuration 10a, 10b receives a single-ended input current signal and provides a differential voltage output at nodes 14a and 14b accordingly. Moreover, the signal TIA 10a is inverting, whereby the output terminal 14a is the negative (−) output and the second output terminal 14b is the positive (+) output. The second output terminal 14b is also capacitively coupled to the base of Q2 via a capacitor C2.

The biasing circuit 10c includes a pair of P-channel MOSFET devices M1 and M2 with their gate terminals connected to one another and with their drain terminals connected together for operation according to the gate voltage VREG. The gates of M1 and M2 are connected to the supply voltage VDD through a capacitor C3 whereby the biasing circuit control voltage VREG is set according to the voltage across the capacitor C3. While M1 and M2 are illustrated as being connected in parallel, other embodiments are possible in which a single FET is used instead, with a gate being controlled according to the voltage VREG. In operation, the collector current I1 of transistor Q1 and the collector current I2 of Q2 are scaled to one another according to the relative sizes of the transistors Q1 and Q2. In the illustrated example, this scaling of the collector currents I1 and I2 corresponds to a ratio N:M as described further below.

The biasing circuit control voltage VREG is modified by operation of the reference circuit 20 which controls a reference current I4 flowing from the biasing FET gate terminals through the reference circuit 20 to the current output terminal Iout 26 of the reference circuit 20 to VSS or ground. In operation, the reference circuit 20 controls the amplitude of the reference current I4 according to the current input signal 28 and the reference current inputs 22 and 24 as described further below in connection with FIG. 4. As seen in FIG. 2, moreover, the preamplifier 10 also includes a current mirror formed by P-channel MOSFETs M3 and M4, with the drain of M4 providing a current I4 in accordance with a current I3 flowing through the M3 and a resistor R3 to a collector of a transistor Q5 whose base terminal is connected to the base of Q2 and whose emitter is connected to VSS as shown.

In certain non-limiting implementations, moreover, the components of the first and second TIAs 10a and 10b are matched to one another according to a scaling factor. In one example, the scaling factor for the matching of the first and second TIAs 10a and 10b is set to N:M with (N>M) to reduce power consumption. However, 1:1 matching may be used in other implementations or M may be greater than N in other embodiments. The AGC signal 34 controls the gain control MOSFETs MRF1 and MRF2 connected across the feedback resistors RF1 and RF2 to control the gain of the dual-TIA preamplifier, and the OC signal 36 controls the offset cancellation circuit MS1 to wholly or at least partially cancel the DC content of the input signal IAN received at the input 12. The OC signal 36 provided by the offset circuit 30 (described further below in connection with FIG. 3) is converted by the voltage-to-current converter circuit 29 to provide a corresponding reference current input signal 28 (Ioc) to the reference circuit 20.

In the embodiment of FIG. 2, the transistor Q5 creates the current I3 as a replica of I2, where I3*M=I2. The current mirror transistors M3 and M4 are matched at a 1:1 matching ratio in one example, and the current I4 is generated based on I3, where M4 is connected to the bout port of the reference circuit 20. The Iout connection to the reference circuit 20 is coupled as shown to the gate terminals of the biasing circuit MOSFETs M1 and M2 and represents a high gain (super mirror output) output node to control the biasing circuit control voltage VREG at the gates of M1 & M2, where the capacitor C3 compensates this control voltage VREG for stability. In this configuration, moreover, the reference current I4 is thus controlled to be equal to Iout.

By operation of the reference circuit 20 according to the OC signal 36 based on the differential voltage output of the preamplifier, Ioc will be very small for small input currents IAN received at node 12, and I4 will be equal to the bias current input Iin at the BIAS input 24 to the reference circuit 20. When the input current signal IAN increases, Ioc 28 will also increase and will raise the biasing circuit control voltage VREG, thereby reducing the bias currents I1 and I2. As a result, increasing input current levels reduce the gains of the TIAs 10*a* and 10*b*, whereby the circuit 10 can accommodate both small and large input current signal levels or ranges. Furthermore, the AGC feedback loop keeps the bandwidth of the TIA-stage almost constant over the whole input current range. Thus, the transfer function quality of the TIAs 10*a* and 10*b* (magnitude and phase) does not significantly change with different input currents IAN received at the input 12, and the preamplifier gain is adjusted automatically to accommodate the input signal level. In addition, the preamplifier 10 maintains the TIA output amplitude moderately small, thereby avoiding or mitigating deep saturation conditions in the signal-path transistor stages. This advantageously facilitates high bandwidth, low PWD & DJ over wide input current ranges, and additionally saves a significant amount of power in overload conditions.

Figure 3:
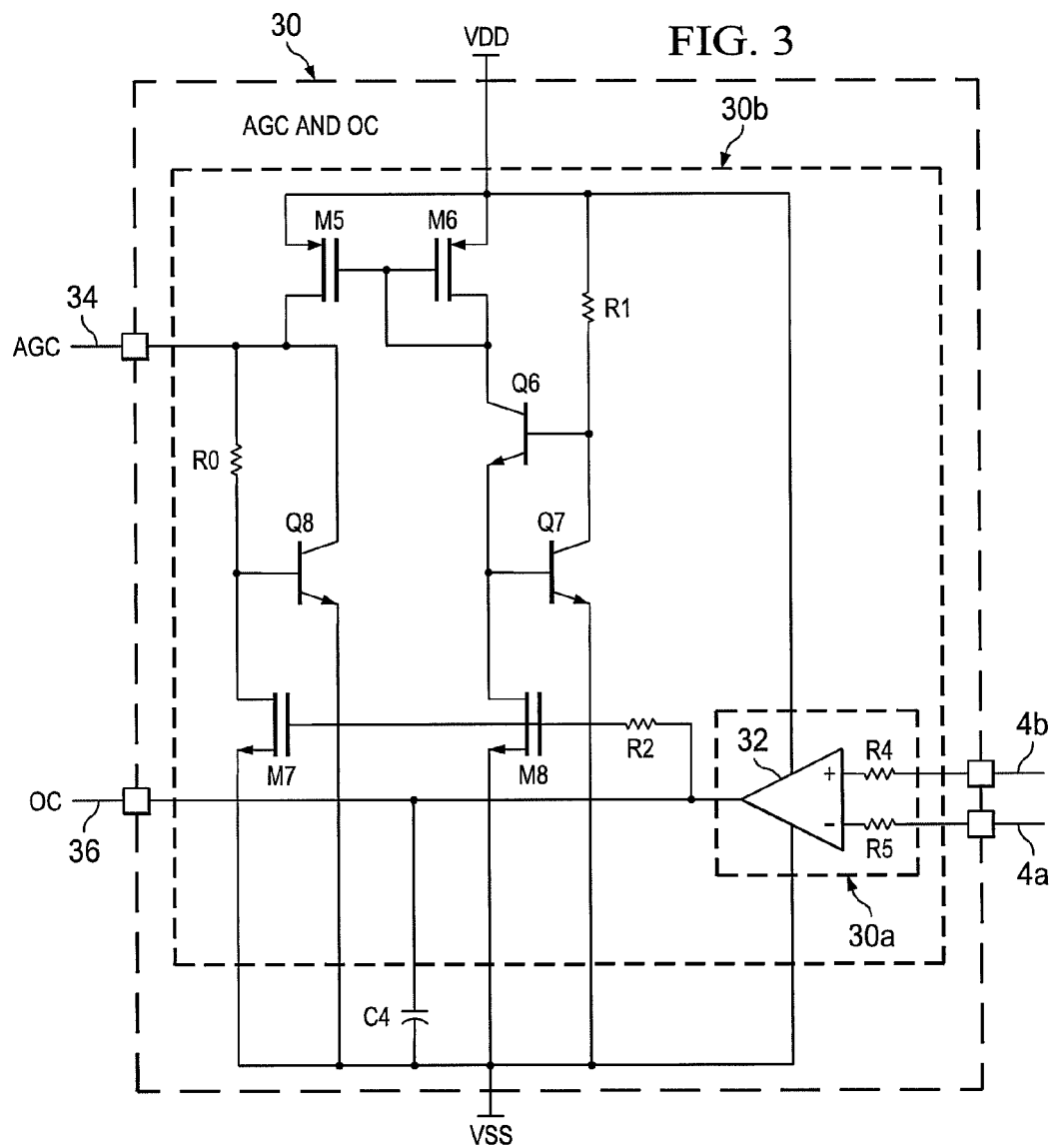
FIG. 3 is a schematic diagram illustrating an exemplary automatic gain control and offset cancellation circuit in the preamplifiers of FIGS. 1 and 2.

FIG. 3 illustrates a non-limiting implementation of an automatic gain control (AGC) and offset cancellation (OC) circuit, referred to herein as an offset circuit 30. As seen in FIG. 3, the circuit 30 receives the amplified differential voltage output from the voltage amplifier 4 (FIG. 1), but other implementations are possible in which the input to the offset circuit 30 is provided directly or indirectly from the differential voltage output terminal 14*a* and 14*b* provided by the first and second TIAs 10*a* and 10*b*. Moreover, while the illustrated embodiments utilize an AGC topology that reacts to the differential output voltage signal amplitude, other implementations are possible in which an AGC circuit (e.g., circuit 30) is coupled to receive the input current signal or a signal derived more directly therefrom.

In addition to the AGC output 34, the offset circuit 30 provides the OC output 36 used as described above. The offset circuit 30 in one example includes an offset cancellation circuit 30*a* with input resistors R4 and R5 and an op amp 32 operated using the supply voltage VDD and ground VSS. The output of the op amp 32 is provided as the OC signal 36 and is stabilized by a capacitor C4 as shown, and also provides a signal used by an AGC circuit portion 30*b*.

The AGC circuit 30*b* provides the signal from the op amp output through a resistor R2 to the gates of N-channel MOSFETs M7 and M8 whose source terminals are connected to VSS as shown. The signal at the gate of M8 controls the base-emitter voltage of an NPN transistor Q7 whose collector is connected through a resistor R1 to VDD and the voltage at the collector of Q7 controls the base-emitter voltage of transistor Q6 to set a current provided to a current mirror formed by M5 and M6. This current flows through M5 and a transistor Q8 whose base emitter voltage is controlled by the drain-source voltage of M7 and thus by the op amp output voltage with resistor R0 and transistors M7 and Q8 providing the AGC output voltage 34 accordingly.

Figure 4:
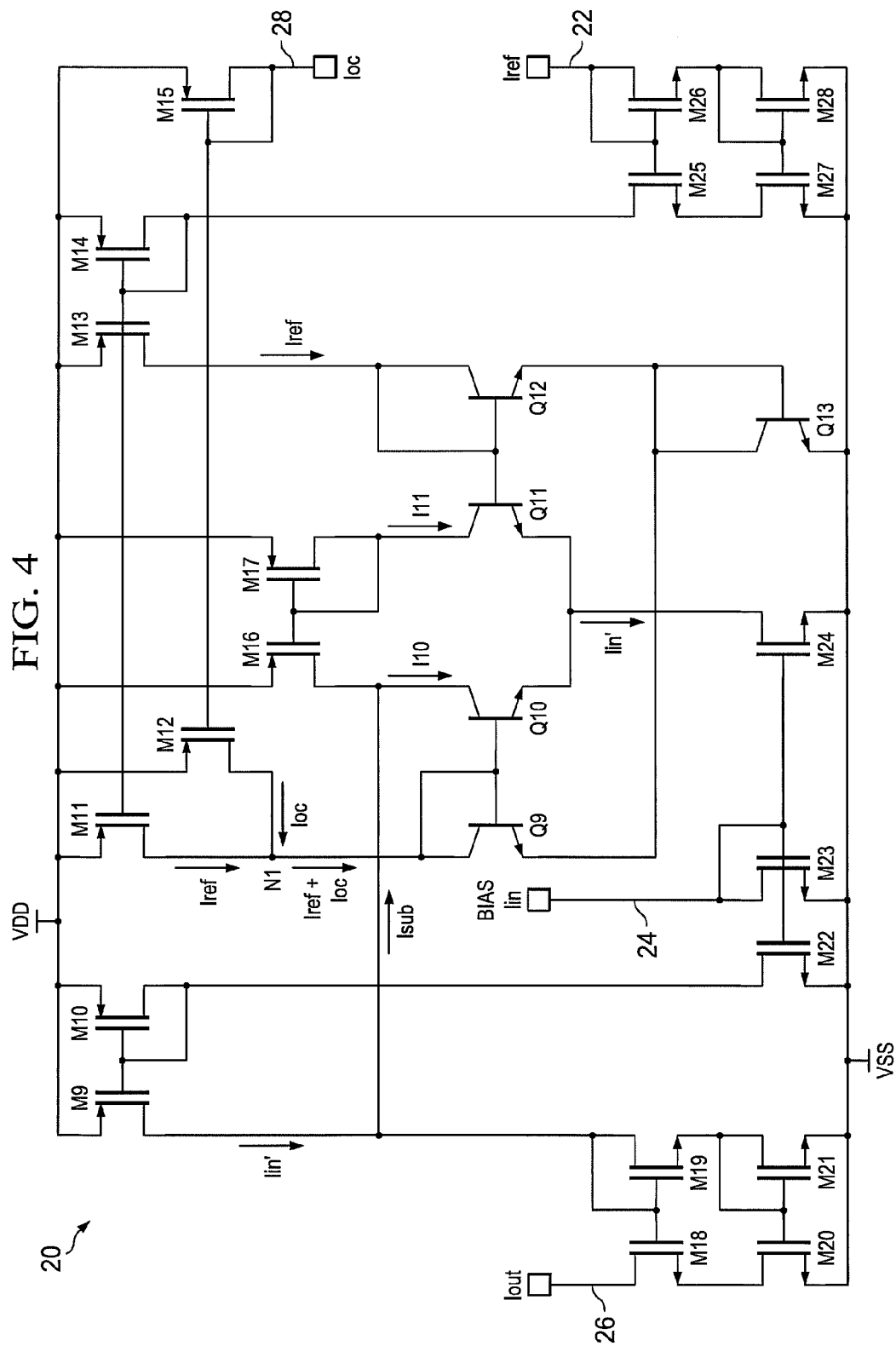
FIG. 4 is a schematic diagram illustrating further details of the reference circuit in the preamplifiers of FIGS. 1 and 2.

Referring now to FIGS. 1, 2 and 4, one possible implementation of the reference circuit 20 is illustrated in FIG. 4 which receives the current input signal Ioc from terminal 28, receives a reference current Iref at terminal 22, a bias current input Iin (BIAS) at terminal 24, and controls the reference current I4 (Iout) via the terminal 26 as described above. The reference circuit 20 includes a two quadrant current multiplier formed by NPN transistors Q9-Q12, with Q10 and Q11 forming a common emitter pair, which has a current Iin' generated by a current source formed by transistors M23 and M24. A transistor Q12 is supplied by a constant current Iref based on the received reference current from terminal 22 as generated by current mirrors M13 and M14, and transistor Q9 is supplied by this current Iref generated by a transistor M11 and a variable current Ioc generated by current mirror M12 and M15 summed at a first node N1. In operation, the currents I10, I11, Iin', Iref and Ioc are related according to the following equations (1) and (2):

$$I10 + I11 = Iin' \quad (1),$$

and $$I10/I11 = (Iref + Ioc)/Iref = K \quad (2),$$

where K is a constant. From equations (1) and (2), the following equations (3) and 4) can be derived:

$$I10 = K*I11 \quad (3),$$

and $$I11 = Iin'/(K+1) \quad (4).$$

Above the two quadrant current multiplier Q9-Q12, is a current mirror formed by transistors M16 and M17, by which a difference or subtractive current Isub is generated which is equal to the difference between the currents I10 and I11, according to the following equation (5):

$$Isub = I10 - I11 \quad (5).$$

The difference current Isub can be characterized by substituting currents I10 and I11 into equation (5) according to equations (3) and (4) by the following equation (6):

$$Isub = Iin'*(K-1)/(K+1) \quad (6).$$

As further seen in FIG. 4, a current source M22 conducts the current Iin', and a current mirror formed by transistors M9 and M10 generates an input current for a current mirror formed by M18, M19, M20 and M24 to provide the output current Iout, which is equal to the difference between Iin' and Isub as shown by the following equation (7):

$$Iout = Iin' - Isub$$

Substituting Isub according to equation (6) into equation (7) results in the following equation (8):

$$Iout = Iin'*2/(K+1); K=(Iref+Ioc)/Iref \quad (8)$$

In one possible embodiment, Ioc is linearly proportional to the TIA input current signal IAN (FIG. 1), while Iref is kept constant with respect to the TIA input current. As a result, Iout in certain embodiments is reciprocal to Ioc as shown in equation (8) above, which is particularly advantageous when using Iout for biasing the TIA input stage. As seen above, therefore, the differential output voltage 14*a*, 14*b* of the TIAs 10*a* and 10*b* is provided according to the received current input signal IAN at node 12 (FIG. 1) as well as according to the biasing current source 10*c* by modification of the biasing currents I1 and I2. The reference circuit 20, moreover, controls the reference current I4 provided to the biasing circuit 10*c* at least partially according to the offset signal 36. The offset signal OC 36, in turn, is provided according to the differential voltage output signal which itself is proportional to the input current signal level. In addition, as seen in FIG. 4, the bias currents I1 and I2 are controlled by operation of the reference circuit 20 at least partially according to the reference current source Iref implemented within the same integrated circuit as the preamplifier 10, and also according to the automatic gain control circuit output signal 34.

The reference circuit 20 controls the reference current I4 according to the reciprocal of the amplitude of the offset signal 36 since Iout is reciprocal to Ioc. This operation raises the bias circuit control voltage VREG thereby reducing the biasing currents I1 and I2 to correspondingly reduce the gains of the transimpedance amplifiers 10a and 10b for increasing differential voltage output signal amplitude (and hence for increasing input current signal levels). The converse is true, where decreasing differential output voltages (and hence decreasing input current signal levels) results in increased bias circuit control voltage VREG and thus increases to the biasing currents I1 and I2 and corresponding increases in the transimpedance amplifier gains.

The disclosure thus presents an advance over the prior preamplifier topologies such as those shown in U.S. Pat. No. 7,233,209 by altering the TIA bias (e.g., bias currents I1 and I2 above) according to the current input signal, as indirectly sensed via the differential voltage output signals. The use of the AGC and offset cancellation circuitry 30 thus extends the input current signal range while retaining the circuit performance with respect to bandwidth, gain, gain-peaking, group-delay and input referenced noise as well as inhibiting pulse width distortion and deterministic jitter. As a result, the circuitry 10 can accommodate wide input signal ranges while still maintaining superior circuit performance by keeping key parameters such as those mentioned above within acceptable ranges and keeping PWD and DJ values relatively low, whereby the power consumption is decreased for high input current levels.

Other embodiments are possible, for example, in which an AGC circuit measures the input current signal level more directly for creation of signals to adjust the TIA biasing and/or gain accordingly. For example, the AGC circuit 30 may be connected to the input 12 of the TIA to sense the voltage between the input 12 and VSS and to provide the AGC and OC output signals 34 and 36 accordingly. In other possible implementations, the offset and AGC circuitry 30 may be connected to a circuit which generates a control signal based on the TIA input signal, e.g., a received signal strength indicator (RSSI) circuit (not shown). Moreover, as discussed above, the AGC and offset cancellation circuitry 30 may alternatively receive the TIA differential voltage output signals directly from nodes 14a and 14b instead of using the output from the voltage amplifier circuit 4.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A preamplifier circuit for converting an input current into an output voltage, the preamplifier circuit comprising:
    a first transimpedance amplifier receiving an input signal representing the input current and providing a first voltage output signal;
    a second transimpedance amplifier matched to the first transimpedance amplifier and providing a second voltage output signal;
    a biasing circuit providing first and second biasing currents to the respective first and second transimpedance amplifiers at least partially according to a reference current;
    a reference circuit controlling the reference current provided to the biasing circuit at least partially according to an offset signal; and
    an offset circuit providing the offset signal to the reference circuit according to a differential voltage output signal derived from the first and second voltage output signals.

2. The preamplifier circuit of claim 1, further comprising a DC cancellation circuit to selectively remove at least a portion of a DC component of the input signal according to the offset signal.

3. The preamplifier circuit of claim 1, further comprising an automatic gain control circuit controlling gains of the first and second transimpedance amplifiers at least partially according to the differential voltage output signal derived from the first and second voltage output signals.

4. The preamplifier circuit of claim 3:
    wherein the first transimpedance amplifier comprises:
        a first input transistor including a base terminal to receive the input signal, a collector terminal coupled to the biasing circuit through a first resistor, and an emitter terminal coupled to a circuit ground node, the collector terminal of the first input transistor providing the first voltage output signal,
        a first output transistor with a base terminal connected to the collector terminal of the first input transistor, and a collector terminal connected to a voltage supply node,
        a first feedback resistor connected between an emitter terminal of the first output transistor and the base terminal of the first input transistor, and
        a first gain control field effect transistor connected in parallel with the first feedback resistor;
    wherein the second transimpedance amplifier comprises:
        a second input transistor including a collector terminal coupled to the biasing circuit through a second resistor, and an emitter terminal coupled to the circuit ground node,
        a second output transistor with a base terminal connected to the collector terminal of the second input transistor, and a collector terminal connected to the voltage supply node,
        a second feedback resistor connected between an emitter terminal of the second output transistor and a base terminal of the second input transistor, and
        a second gain control field effect transistor connected in parallel with the second feedback resistor; and
    wherein the automatic gain control circuit provides a gate control signal to the first and second gain control field effect transistors at least partially according to the differential voltage output signal to reduce the gains of the first and second transimpedance amplifiers for increasing differential voltage output signal amplitude and vice versa.

5. The preamplifier circuit of claim 4, further comprising a DC cancellation circuit to selectively remove at least a portion of a DC component of the input signal according to the offset signal.

6. The preamplifier circuit of claim 5, wherein the reference circuit controls the reference current at least partially according to a reciprocal of an amplitude of the offset signal to reduce the first and second biasing currents and thereby reduce the gains of the first and second transimpedance amplifiers for increasing differential voltage output signal amplitude and vice versa.

7. The preamplifier circuit of claim 3, further comprising a DC cancellation circuit to selectively remove at least a portion of a DC component of the input signal according to the offset signal.

8. The preamplifier circuit of claim 3, wherein the reference circuit controls the reference current at least partially according to a reciprocal of an amplitude of the offset signal to reduce the first and second biasing currents and thereby reduce the gains of the first and second transimpedance amplifiers for increasing differential voltage output signal amplitude and vice versa.

9. The preamplifier circuit of claim 1:
wherein the first transimpedance amplifier comprises:
a first input transistor including a base terminal to receive the input signal, a collector terminal coupled to the biasing circuit through a first resistor, and an emitter terminal coupled to a circuit ground node, the collector terminal of the first input transistor providing the first voltage output signal,
a first output transistor with a base terminal connected to the collector terminal of the first input transistor, and a collector terminal connected to a voltage supply node, and
a first feedback resistor connected between an emitter terminal of the first output transistor and the base terminal of the first input transistor; and
wherein the second transimpedance amplifier comprises:
a second input transistor including a collector terminal coupled to the biasing circuit through a second resistor, and an emitter terminal coupled to the circuit ground node,
a second output transistor with a base terminal connected to the collector terminal of the second input transistor, and a collector terminal connected to the voltage supply node, and
a second feedback resistor connected between an emitter terminal of the second output transistor and a base terminal of the second input transistor.

10. The preamplifier circuit of claim 1, wherein the reference circuit controls the reference current at least partially according to a reciprocal of an amplitude of the offset signal to reduce the first and second biasing currents and thereby reduce gains of the first and second transimpedance amplifiers for increasing differential voltage output signal amplitude and vice versa.

11. An integrated circuit apparatus, comprising:
a biasing circuit including first and second P-channel FETs with gate terminals coupled to one another, source terminals coupled to a voltage supply node, and drain terminals respectively providing first and second biasing currents according to a control voltage at the gate terminals;
first and second transimpedance amplifiers individually comprising:
an NPN input transistor including a collector terminal coupled to receive the first and second biasing currents from the biasing circuit through a corresponding resistor, and an emitter terminal coupled to a circuit ground node, the collector terminals of the input transistors providing a differential voltage output signal,
an NPN output transistor with a base terminal connected to the collector terminal of the input transistor, and a collector terminal connected to the voltage supply node, and
a feedback resistor connected between an emitter terminal of the output transistor and a base terminal of the input transistor;
wherein the base terminal of the input transistor of the first transimpedance amplifier is connected to receive an input signal, and the transimpedance amplifiers provide the differential voltage output signal representing an amplitude of the input signal; and
a reference circuit providing a reference current output to modify the control voltage provided to the biasing circuit to control the first and second biasing currents at least partially according to the differential voltage output signal and according to a reference current generated in the integrated circuit.

12. The integrated circuit apparatus of claim 11, further comprising an N-channel FET coupled between the base terminal of the input transistor of the first transimpedance amplifier and the circuit ground node and having a gate terminal controlled at least partially according to the differential voltage output signal to selectively remove at least a portion of a DC component of the input signal.

13. The integrated circuit apparatus of claim 12, further comprising an automatic gain control circuit controlling gains of the first and second transimpedance amplifiers at least partially according to the differential voltage output signal.

14. The integrated circuit apparatus of claim 13, wherein the individual transimpedance amplifiers include a gain control field effect transistor connected in parallel with the corresponding feedback resistor, and wherein the automatic gain control circuit provides a gate control signal to the gain control field effect transistors at least partially according to the differential voltage output signal to reduce the gains of the first and second transimpedance amplifiers for increasing differential voltage output signal amplitude and vice versa.

15. The integrated circuit apparatus of claim 14, wherein the reference circuit controls the reference current output at least partially according to a reciprocal of an amplitude of the differential voltage output signal to reduce the first and second biasing currents and thereby reduce the gains of the first and second transimpedance amplifiers for increasing differential voltage output signal amplitude and vice versa.

16. The integrated circuit apparatus of claim 11, further comprising an automatic gain control circuit controlling gains of the first and second transimpedance amplifiers at least partially according to the differential voltage output signal;
wherein the individual transimpedance amplifiers include a gain control field effect transistor connected in parallel with the corresponding feedback resistor; and
wherein the automatic gain control circuit provides a gate control signal to the gain control field effect transistors at least partially according to the differential voltage output signal to reduce the gains of the first and second transimpedance amplifiers for increasing differential voltage output signal amplitude and vice versa.

17. The integrated circuit apparatus of claim 16, wherein the reference circuit controls the reference current output at least partially according to a reciprocal of an amplitude of the differential voltage output signal to reduce the first and second biasing currents and thereby reduce the gains of the first and second transimpedance amplifiers for increasing differential voltage output signal amplitude and vice versa.

18. The integrated circuit apparatus of claim 11, wherein the reference circuit controls the reference current output at least partially according to a reciprocal of an amplitude of the differential voltage output signal to reduce the first and second biasing currents and thereby reduce the gains of the first and second transimpedance amplifiers for increasing differential voltage output signal amplitude and vice versa.

19. The integrated circuit apparatus of claim 11, wherein the first and second transimpedance amplifiers are matched.

20. A preamplifier for converting a single-ended input current signal to a differential output voltage signal, comprising:
- a signal transimpedance amplifier including a first input transistor with a base terminal receiving the single-ended input current signal and a first output transistor;
- a dummy transimpedance amplifier matched to the signal transimpedance amplifier and including a second input transistor receiving no input signal and a second output transistor;
- wherein the signal and dummy transimpedance amplifiers provide the differential output voltage signal at least partially according to the single-ended input current signal and according to a biasing current source derived from a reference current source implemented within the preamplifier and an automatic gain control circuit output signal.

* * * * *